United States Patent [19]

Geurts

[11] Patent Number: 4,670,718
[45] Date of Patent: Jun. 2, 1987

[54] FREQUENCY SYNTHESIZING CIRCUIT

[75] Inventor: Martinus F. A. M. Geurts, Nijmegen, Netherlands

[73] Assignee: U.S. Philips Corporation, New York, N.Y.

[21] Appl. No.: 824,300

[22] Filed: Jan. 30, 1986

Related U.S. Application Data

[63] Continuation of Ser. No. 452,568, Dec. 23, 1982, abandoned.

[30] Foreign Application Priority Data

Jan. 8, 1982 [NL] Netherlands ............................ 8200050

[51] Int. Cl.⁴ ...................... H03B 19/00; H03K 3/017
[52] U.S. Cl. ...................................... 328/14; 328/111; 328/155; 307/265; 307/267; 307/234; 455/165; 331/1 A
[58] Field of Search ............... 307/524, 239, 234, 265, 307/267; 328/155, 165, 120, 111, 135, 136, 14, 63; 331/1 A, 2; 455/165

[56] References Cited

U.S. PATENT DOCUMENTS 2,980,858  4/1961  Grondin et al. ...................... 328/63
3,889,186  5/1975  Larson ............................... 324/83 D
4,392,253  6/1983  Yamada et al. ...................... 455/165
4,533,880  8/1985  Geurts .............................. 331/1 A

OTHER PUBLICATIONS

"SAB 2024 Tuning Circuit for Video Carrier Frequencies", Valvo Entwicklungsmitteilungen, Nov. 1977, pp. 33-35.

Primary Examiner—Stanley D. Miller
Assistant Examiner—Richard Roseen
Attorney, Agent, or Firm—Thomas A. Briody; William J. Streeter; Leroy Eason

[57] ABSTRACT

In a frequency synthesizing circuit the deviation of the frequency of an oscillator signal which is transmitted (at 7) by a measuring gate (79) from a desired frequency (output 47) is converted into a control signal (at 3) for the oscillator (11). In order to prevent the occurrence of an average frequency-deviation due to a continuous change of the phase relationship between a test pulse (m) controlling the measuring gate (79) and the oscillator signal, an additional pulse (output 83 or 85) is added (via 81) to the output signal of the measuring gate (79). This additional pulse must occur contiguous to the test pulse. (FIG. 1).

4 Claims, 2 Drawing Figures

FREQUENCY SYNTHESIZING CIRCUIT

This is a continuation of application Ser. No. 452,568, filed Dec. 23, 1982, now abandoned.

BACKGROUND OF THE INVENTION

1. Field of the Invention

The invention relates to a frequency synthesizing circuit comprising an oscillator whose frequency is controllable by a control signal, a tuning data signal source, a digital difference-determining circuit for determining the digital value of the difference between the frequency specified by the tuning data signal source and the oscillator frequency, and a digital-to-analog converter for converting such digital difference into a control signal.

2. Description of the Related Art

In such a circuit, an input of the difference-determining circuit is coupled to the output of a gate circuit, an input of the gate circuit being coupled to the output of the oscillator and a measuring pulse input of the gate circuit being supplied with a measuring pulse by a pulse generator coupled thereto. In prior frequency synthesizing circuits of this kind the tuning frequency of the oscillator deviates on average to some extent from the frequency specified by the tuning data signal source.

SUMMARY OF THE INVENTION

The invention is a frequency synthesizing circuit of the aforesaid kind which corrects the inaccuracy in the oscillator frequency by incorporating in the gate circuit a logic circuit which adds a pulse contiguous with the trailing end of the measuring pulse to the signal which is supplied by the gate circuit to the difference-determining circuit. This added pulse prevents a change in the phase shift of the measuring pulse relative to the oscillator signal being measured from causing the difference-determining circuit to signify a frequency deviation even though the oscillator is correctly tuned, which is the cause of the above-mentioned deviation of the oscillator tuning in prior frequency synthesizing circuits of this kind.

DESCRIPTION OF THE PREFERRED EMBODIMENTS

Figure 1:
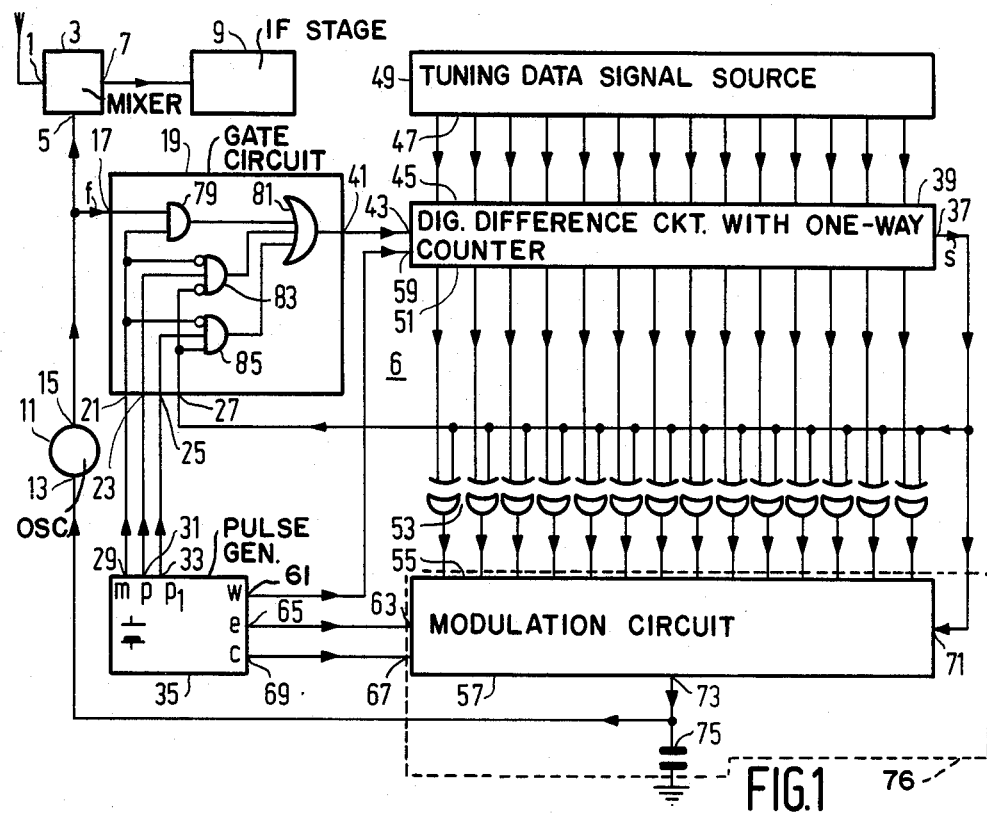
FIG. 1 is a block schematic circuit diagram of a receiver incorporating a frequency synthesizing circuit in accordance with the invention.

In FIG. 1, a received signal is applied to an input 1 of a high-frequency mixing section 3. An input 5 of the high-frequency mixing section 3 receives an oscillator signal from a frequency synthesizing circuit 6. In response thereto there is produced at output 7 of high-frequency mixing section 3 an intermediate frequency signal which is converted by IF processing circuit 9 into a form suitable for display or reproduction; for example, picture display or sound reproduction.

The frequency synthesizing circuit 6 comprises an oscillator 11 whose frequency is controllable by a control signal applied to input 13 thereof. The output 15 of oscillator 11 is connected to the input of the high-frequency mixing section 3 and also to an input 17 of a gate circuit 19. For the sake of clarity, frequency dividers, amplifiers or limiters which may be included in the connection to the input 17 of gate circuit 19 are not shown.

Figure 2:
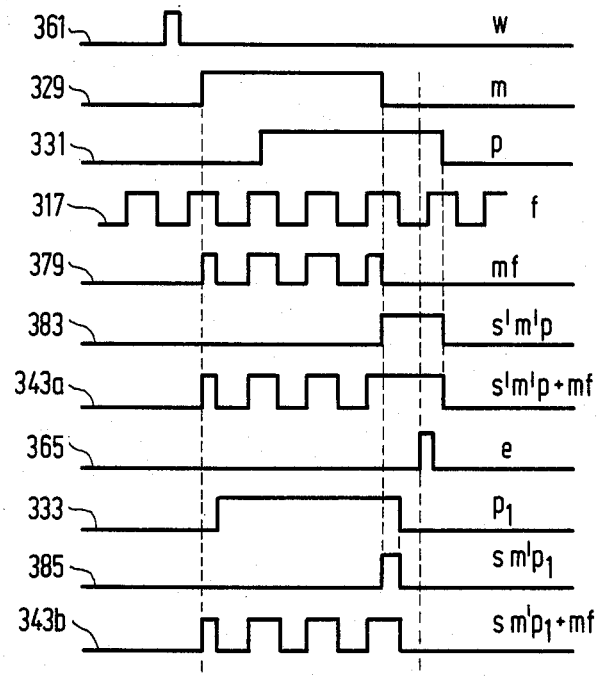
FIG. 2 illustrates the waveforms of signals involved in the operation of the circuit shown in FIG. 1.

The output of oscillator 11 is a signal "f" shown by waveform 317 in FIG. 2, and is applied to the input 17 of gate circuit 19. Further inputs 21, 23 and 25 of gate circuit 19 are respectively connected to outputs 29, 31 and 33 of a pulse signal generator 35, a fourth input 27 of gate circuit 19 being connected to an output 37 of a difference-determining circuit 39. The respective inputs 21, 23 and 25 of gate circuit 19 receive a measuring pulse "m", a pulse "p" and a pulse "$p_1$", respectively, from the respective outputs 29, 31 and 33 of pulse generator 35. In FIG. 2 these signals are shown by the waveforms 329, 331 and 333, respectively. The fourth input 27 of gate circuit 19 receives a sign signal "s" from the output 37 of difference-determining circuit 39.

An output 41 of gate circuit 19 is connected to an input 43 of difference-determining circuit 39, which as a result receives a signal having waveform 343a or 343b shown in FIG. 2.

The difference-determining circuit 39 has an input combination 45 which is connected to an output combination 47 of a tuning data signal source 49. Circuit 39 also has an output combination 51 the terminals of which are respectively connected to respective input terminals of an input combination 55 of a modulation circuit 57 via one of the exclusive-OR-gates of an exclusive-OR-gate circuit 53. Another input of each of the exclusive-OR-gates 53 is connected to the sign signal output 37 of difference-determining circuit 39. A write signal input 59 of difference-determining circuit 39 receives a write signal "w" from an output 61 of pulse signal generator 35. The signal "w" is shown by waveform 361 in FIG. 2.

The modulation circuit 57 has a further input 63 to which a read signal "e" provided at output 65 of pulse generator 35 is applied, shown in FIG. 2 as waveform 365. A clock signal input 67 of modulation circuit 57 receives a clock signal, not shown in FIG. 2, from an output of pulse generator 35. The sign signal "s" from output 37 of difference-determining circuit 39 is applied to a further input 71 of modulation circuit 57, but is not shown in FIG. 2 because it does not occur periodically.

A capacitor 75 is connected to the output 73 of modulation circuit 57. Capacitor 75 and modulation circuit 57 constitute a digital-to-analog converter 76. Output 73 is connected to the control signal input 13 of oscillator 11 and supplies a control signal thereto.

Gate circuit 19 incorporates an AND-gate 79 which is connected to gate circuit inputs 17 and 21 and which supplies an output signal "mf", denoted in FIG. 2 by waveform 379, to an input of an OR-gate 81. Another input of OR-gate 81 is connected to the output of an AND-gate 83, an input of which is connected to gate circuit input 33 and which has inverting inputs which are connected to gate circuit inputs 21 and 27. AND-gate 83 supplies an output signal $\overline{smp}$ denoted in FIG. 2 by waveform 383 to an input of OR-gate 81. A further input of OR-gate 81 is connected to the output of another AND-gate 85, an inverting input of which is connected to gate circuit input 21 and other inputs of which are respectively connected to gate circuit inputs 25 and 27. AND-gate 85 thereby applies to OR-gate 81 an output signal $\overline{smp}_1$ which is shown in FIG. 2 as waveform 385. The total signal supplied to OR-gate 81 is therefore $\overline{smp} + \overline{sm}_1 + mf$.

The waveforms in FIG. 2, which are not represented to scale, occur periodically.

Frequency synthesizing circuit operates as follows.

In response to the write signal "w" supplied by pulse generator 35 to input 59 of difference-determining circuit 39, which comprises a measuring counter, the count thereof is set to correspond to the binary number supplied by tuning data signal source 49 and its output combination 47, which binary number represents the desired tuning frequency of oscillator 11.

Thereafter, at the trailing edge of each pulse occurring at its input 43, the count of the measuring counter in difference-determining circuit 39, hereinafter termed measuring counter 39, decreases by one.

As long as the count of measuring counter 39 does not pass through zero the sign signal "s" at output 37 of difference determining circuit 39 remains at zero and the exclusive-OR gates 53 convey the count produced at output combination 51 thereof to the input combination 55 of modulation circuit 57. If the count of measuring counter 39 passes through zero, the sign signal "s" produced at output terminal 37 becomes one and the exclusive-OR-gates 53 invert the count which is conveyed to the input combination 55 of modulation circuit 57.

Modulation circuit 57 incorporates a counter which at the instant of occurrence of the read signal "e" at input 63 assumes the count of the measuring counter 39 as conveyed by the exclusive-OR-gates 53. Thereafter, in response to the clock pulses "c" at its input 67, modulation circuit 57 counts to zero and then stops. As a result, there is produced at output 73 of modulation circuit 57 a current pulse whose duration depends on the count of the measuring counter 39 at the instant of occurrence of the read signal "e" and on the direction signified by the sign signal "s" produced by the measuring counter 39. These periodically occurring current pulses charge or discharge the capacitor 75, which supplies the control signal to oscillator 11. The number of trailing pulse edges occurring between the write signal "w" and the read signal "e" at the input 43 of measuring counter 39 will therefore correspond to the number supplied by the tuning data signal source 49. This number of trailing pulse edges is determined by gate circuit 19.

If the signal at the output 41 of gate circuit 19 were only produced, as in the prior art, by the AND-gate 79, then a number "n", for example n=3, periods of the oscillator signal could be included in the period "m" of the measuring pulse. In these three periods the number of trailing pulse edges could be three or four, depending on the phase relationship between the measuring pulse "m" and the oscillator signal "f" to be measured. This phase can vary continuously, as the phase of pulse generator 35 is not coupled to the phase of the oscillator signal "f" to be measured. In response to the operation of the frequency synthesizing circuit the frequency of the oscillator signal f would be controlled such that half the time it is n+1/T, wherein T is the period of the measuring pulse "m", and half the time it is n/T. The average frequency could thereby deviate by $\frac{1}{2} \cdot 1/T$ from the desired value.

In order to obviate this error, when the sign signal "s" is zero the additional AND-gate 83 in gate circuit 19 supplies an additional pulse $\overline{smp}$ to the signal mf applied to OR-gate 81. This additional pulse is contiguous with the trailing edge of measuring pulse "m" and continues after the occurrence of the read signal "e". Consequently, independent of the phase relationship between measuring pulse "m" and oscillator signal "f", always three, or in general "n", trailing pulse edges will occur at the output of gate circuit 19 in the interval between the write signal "w" and the read signal "e", if the measuring pulse period is n-times the period of the oscillator signal "f". This is shown by the waveform 343a in FIG. 2.

When its count passes through zero, the difference-determining counter 39 causes the sign signal "s" at its output to change from zero to one. As a result, the exclusive-OR-gate combination 53 supplies a count having the value zero, both at the zero count and at the minus-one count of measuring counter 39.

The AND-gate 85 ensures that at negative values of the count of the measuring counter one more pulse is counted because of the fact that the added pulse $\overline{smp}_1$ becomes zero, so that the output signal of gate circuit 19 now has, in accordance with waveform 343b in FIG. 2, an additional trailing edge at the occurrence of the write signal "w" and the read signal "e". Consequently, the occurrence twice consecutively of a zero value at the input combination 55 of modulation circuit 57 is prevented from occurring, and also negative values of the count of measuring counter 39 are converted into absolute values by the exclusive OR-gate 53.

It will be obvious that this last measure would not be required if an up-down counter is employed in the difference-determining circuit 39.

It will further be obvious that if so desired the same result could be accomplished by adding an additional pulse which is contiguous to the leading edge of the measuring pulse "m" and by adequate choice of the location thereof relative to the write signal "w", if the measuring counter of the difference-determining circuit 39 counts positive edges.

It will further be obvious that, if so desired, instead of shifting the relevant edge of the additional pulse by means of the sign signal "s" the positions of the read signal "e" or of the write signal "w" may be shifted when a measuring counter counting positive edges is used.

The frequency synthesizing circuit 6 is here described as forming part of a receiver. It could, of course, form part, for example, of a transmitter or a measuring instrument.

If so desired other gate combination in the gate circuit could be used to obtain corresponding logic functions.

The signals "p" and "p$_1$" may be delayed measuring pulses or may be obtained in a different manner.

What is claimed is:

1. A frequency synthesizing circuit comprising oscillator means furnishing an oscillator output signal having a frequency controllable by a control signal, a tuning data signal source for generating a tuning data signal signifying a desired oscillator frequency, digital difference determining means for generating a digital difference signal signifying the difference in frequency between said tuning data signal and said oscillator output signal, digital-to-analog converter means for converting said digital difference signal into said control signal, gate circuit means coupling said oscillator means to said digital difference determining means, said gate circuit means having a measuring pulse input and auxiliary pulse inputs and furnishing an input signal to said digital difference determining means in response to said oscillator signal when a measuring pulse is applied to said measuring pulse input, and pulse generator means for applying said measuring pulse to said measuring pulse input and applying auxiliary pulses to said auxiliary pulse inputs of said gate circuit means; the improvement characterized in that:

said gate circuit means comprises a logic circuit for supplying providing an additional pulse which is contiguous with one edge of said measuring pulse to said digital difference determining means, such additional pulse being derived from said measuring pulse and said auxiliary pulses, such additional pulse causing said difference circuit to generate a digital difference signal which is independent of the phase relationship between the measuring pulse and the oscillator output signal.

2. A frequency synthesizing circuit as claimed in claim 1, wherein said logic circuit changes the duration of said additional pulse.

3. A frequency synthesizing circuit as claimed in claim 1, wherein said digital difference determining means comprises a one-way counter having a plurality of counter outputs and a sign signal output, and wherein:

said frequency-determining circuit further comprises:

exclusive OR-gate means having a plurality of inputs connected to said plurality of counter outputs, a further input connected to said sign signal output, and a plurality of outputs connected to said digital-analog converter means; and means for connecting said sign signal output to said logic circuit;

said additional pulse has a leading and a trailing pulse edge;

said pulse generator means further comprises means for applying a write signal to said digital difference determining means and a read signal to said digital-analog converter means; and said logic circuit changes the position of one of said pulse edges of said additional pulse relative to said write or read signal.

4. A frequency synthesizing circuit as claimed in claim 3, characterized in that said gate circuit has a gate function expressed by the logic formula $\overline{smp} + \overline{smp_1} + mf$, wherein s is the sign signal, f is the oscillator output signal, p is a pulse having a leading edge occurring before the trailing edge of the measuring pulse and a trailing edge occurring after the read, and $p_1$ is a pulse having a leading edge occurring before the end of the measuring pulse and a trailing edge occurring prior to said read signal.

* * * * *